United States Patent [19]
Lu et al.

[11] Patent Number: 5,395,784
[45] Date of Patent: Mar. 7, 1995

[54] METHOD OF MANUFACTURING LOW LEAKAGE AND LONG RETENTION TIME DRAM

[75] Inventors: Chih-Yuan Lu, Taipei; Nicky C. Lu, Hsin-Chu; Hsiao-Chin Tuan, Hsinchu, all of

[73] Assignee: Industrial Technology Research Institute, Hsin-Chu, Taiwan, Prov. of China

[21] Appl. No.: 46,777

[22] Filed: Apr. 14, 1993

[51] Int. Cl.$^6$ .................... H01L 21/70; H01L 27/00
[52] U.S. Cl. ........................ 437/52; 437/60; 437/919
[58] Field of Search ............ 437/52, 919, 60, 43

[56] References Cited

U.S. PATENT DOCUMENTS

| | | | |
|---|---|---|---|
| 4,252,579 | 2/1981 | Ho et al. | 156/643 |
| 4,679,172 | 7/1987 | Kirsch et al. | 365/222 |
| 4,734,384 | 3/1988 | Tsuchiya | 437/52 |
| 4,784,969 | 11/1988 | Nitayama | 437/41 |
| 4,808,548 | 2/1989 | Thomas et al. | 437/52 |
| 4,873,205 | 10/1989 | Critchlow et al. | 437/200 |
| 4,977,099 | 12/1990 | Kotaki | 437/52 |
| 5,017,506 | 5/1991 | Shen et al. | 437/52 |
| 5,071,784 | 12/1991 | Takeuchi et al. | 437/52 |
| 5,116,776 | 5/1992 | Chan et al. | 437/52 |
| 5,155,056 | 10/1992 | Jeong-Gyoo | 437/47 |
| 5,182,224 | 1/1993 | Kim et al. | 437/52 |
| 5,227,325 | 7/1993 | Gonzalez | 437/52 |
| 5,273,928 | 12/1993 | Tani | 437/52 |

OTHER PUBLICATIONS

Wolf et al. Silicon processing for the VLSI GRA vol. 1 pp. 307–308, 1986.

*Primary Examiner*—Olik Chaudhuri
*Assistant Examiner*—H. Jey Tsai
*Attorney, Agent, or Firm*—George O. Saile

[57] ABSTRACT

A method for making a DRAM MOSFET integrated circuit and resulting device having low leakage and long retention time in a semiconductor wafer is described. A pattern of gate dielectric and gate electrode structures is provided over the semiconductor wafer having a first conductivity imparting dopant in the cell array region and the peripheral circuits region of the integrated circuit. The pattern of gate dielectric and gate electrode structures as a mask for ion implantation to form lightly doped regions of a second and opposite conductivity imparting dopant in the semiconductor wafer wherein certain of the lightly doped regions within the cell array region are to be bit line regions and capacitor node regions. A capacitor is formed within the cell array region. An interlevel dielectric insulating layer is formed over the surface of the structure. A highly doped bit line contact is formed to the bit line regions. The structure is heated to anneal out the ion implantation damage in the lightly doped regions caused by the ion implantation into the lightly doped regions and to cause outdiffusion from the doped bit line contact layer to form a highly doped bit line contact within certain of the lightly doped regions wherein the low leakage and long retention time are the resulting circuit characteristics.

15 Claims, 6 Drawing Sheets

METHOD OF MANUFACTURING LOW LEAKAGE AND LONG RETENTION TIME DRAM

BACKGROUND OF THE INVENTION (1) Field of the Invention

The invention relates to a method and resulting structure to form dynamic random access memory (DRAM) cell array and peripheral circuits integrated circuits and more particularly to the formation of such DRAM structures which have low leakage and long retention time characteristics.

(2) Description of the Prior Art

Dynamic random access memories (DRAMs) store information by placing a desired voltage on a storage capacitor. The capacitor is thus charged or discharged. The stored voltage is normally at one of two levels, referred to as the binary "1" and "0" levels. The charge is transferred into or out of the storage capacitor by means of an switch transistor. The access transistor is typically a metal oxide semiconductor field effect transistor (MOSFET), wherein a voltage placed on the gate controls the conduction of charge through the channel between the source and drain electrodes.

DRAMs by their nature require periodic refreshing of the information stored in the cells. This refreshing is needed because of the leakage of the charge stored in the capacitor. There are various leakage mechanisms, such as from the capacitor to the substrate or through the switch transistor. Workers in the field have long worked upon this problem to give the desired characteristics of low leakage and long charge retention (hold) time in DRAM integrated circuits. One usual approach is to provide circuit improved circuit designs such as shown by Kirsch et al U.S. Pat. No. 4,679,172. Other approaches include that by K. Sawada et al, who used a self-aligned refresh scheme, namely a leak sensor, to ease the hold time control issue as published in the 1986 Symposium on VLSI Technology, May 28–30, 1986, in San Diego, pp. 85–86. However, these circuit improvements are at the expense of chip size, design complexity, etc.

As the progress of the DRAMs to ever smaller feature sizes and larger memories on a single integrated circuit chip, unexpected anomalous leakage problems were found. D. S. Yaney and C. Y. Lu et al first described such a leakage problem in their "A METASTABLE LEAKAGE PHENOMENON IN DRAM CHARGE STORAGE-VARIABLE HOLD TIME" published at the IEDM in Washington, D. C. Dec. 6–9, 1987 pages 336–339. The new leakage phenomenon which was called variable hold time (VHT). Stable periods last from seconds to hours and are punctuated by nearly instantaneous transitions. Physical investigation evidence in many cases uncovered a silicon material defect present in the offending cell, according to the authors. These anomalous leakage problems were also reported and studied by P. J. Restle et al, in a number of technologies by a variety of manufactures, as published at IEDM in San Francisco, December 1992, pp. 807–810, and including both trench capacitor and stacked capacitor DRAM chips.

There are two types of DRAM memory array cells that are used in the technology. One type is the MOSFET in combination with a stacked storage capacitor such as describe in R. Lee U.S. Pat. No. 5,066,606; Chan et al U.S. Pat. No. 5,116,776 and Jeong-Gyoo U.S. Pat. No. 5,155,056. The other type is the MOSFET in combination with a trench capacitor such as described in Ho et al U.S. Pat. No. 4,252,579; Tsuchiya U.S. Pat. No. 4,734,384; Chritchlow et al U.S. Pat. No. 4,873,205; Nitayama U.S. Pat. No. 4,784,969; Ogura et al U.S. Pat. No. 4,798,794; Nicky C. C. Lu et al "A SUBSTRATE-PLATE TRENCH-CAPACITOR (SPT) MEMORY CELL FOR DYNAMIC RAM'S" published in IEEE J. of Solid-State Circuits, Vol SC-21, No. 5, October 1986; and B. W. Shen et al "SCALABILITY OF A TRENCH CAPACITOR CELL FOR 64 MBIT DRAM" published in 1989 IEDM Technical Digest pages 27–30. Of these patents or papers address only the above cited B. W. Shen et al paper discusses the problem of leakage as the DRAM product technology moves to smaller and smaller devices. Shen et al discusses the trench capacitor leakage problem and solves the problem by raising the substrate concentration at the risk of the trench wall diode breakdown.

It is an object of this invention to provide methods which will result in the lowest possible leakage and the longest possible retention (hold) time in a DRAM array cell.

It is a further object of this invention to provide a method which uses only lightly doped ion implanted regions in the cell array of a DRAM structure and which are then heated to completely anneal the damage caused by the ion implantation.

It is a still further object of this invention to provide a DRAM integrated circuit structure which as lightly doped ion implanted regions which have been annealed in the cell array with outdiffused highly doped contacts in the lightly doped node regions and bit line regions of the cell array whereby the lowest possible leakage and the longest possible retention (hold) time, with minimum variable hold time (VHT) anomalous phenomenon, in a DRAM array cell is achieved.

SUMMARY OF THE INVENTION

In accordance with the above objects, a method for making a DRAM MOSFET integrated circuit having low leakage and long retention time in a semiconductor wafer is described. A pattern of gate dielectric and gate electrode structures is provided over the semiconductor wafer having a first conductivity imparting dopant in the cell array region and the peripheral circuits region of the integrated circuit. The pattern of gate dielectric and gate electrode structures as a mask for ion implantation to form lightly doped regions of a second and opposite conductivity imparting dopant in the semiconductor wafer wherein certain of the lightly doped regions within the cell array region are to be bit line regions and capacitor node regions. Insulator structures are formed upon the sidewall of the pattern of gate dielectric and gate electrode structures. A capacitor is formed within the cell array region. An interlevel dielectric insulating layer is formed over the surface of the structure. Openings are formed through the interlevel dielectric insulating layer to the bit line regions of lightly doped regions. A highly doped bit line contact is formed to the bit line regions. The structure is heated to anneal out the ion implantation damage in the lightly doped regions caused by the ion implantation into the lightly doped regions and to cause outdiffusion from the doped bit line contact layer to form a highly doped bit line contact within certain of the lightly doped regions whereby the low leakage and long retention time are the resulting circuit characteristics. Openings are formed to the desired lightly doped regions of the peripheral circuits. Ion implantation of highly doped conductivity imparting dopants of the second and opposite conductivity are made through said openings to form highly doped regions of the second and opposite conductivity. This reduces the hot carrier problem. Electrical contact are made to the peripheral circuits through the openings to complete the DRAM MOSFET integrated circuit.

Further in accordance with the invention, a DRAM integrated circuit having a cell array composed of MOSFET devices and associated stacked capacitors, and peripheral circuits is described wherein there is low leakage and long retention time in said cell array. A pattern of gate dielectric and gate electrode structures are located over a semiconductor wafer having a first conductivity imparting dopant in the cell array region and the peripheral circuits region of the integrated circuit. Lightly doped regions of a second and opposite conductivity imparting dopant are located in the semiconductor wafer and adjacent to the pattern of gate dielectric and gate electrode structures wherein the lightly doped regions within the cell array region to be capacitor node regions and bit line regions. Insulator structures are upon the sidewall of the pattern of gate dielectric and gate electrode structures. The stacked capacitors are in electrical contact with capacitor node regions of the lightly doped regions within the cell array region. The capacitor includes a doped polysilicon node layer of the second and opposite conductivity, a capacitor dielectric, and a doped polysilicon plate layer. An interlevel dielectric insulating layer is located over the surface of the structure. Openings through the interlevel dielectric insulating layer are made to the bit line regions of lightly doped regions. A highly doped polycide bit line contact is made to the bit line regions. A highly doped node contact and highly doped bit line contact, respectively within the lightly doped regions formed by outdiffusion from the doped capacitor node layer and the doped bit line contact layer whereby the low leakage and long retention time are the resulting circuit characteristics. Openings are made to the desired source and drain regions of the peripheral circuits. Other optional highly doped regions of second and opposite conductivity are formed at the bottom of the openings and in the source/drain regions. Electrical contacts are made to the peripheral circuits through the openings to complete the DRAM MOSFET integrated circuit.

BRIEF DESCRIPTION OF THE PREFERRED EMBODIMENTS

Figure 1:
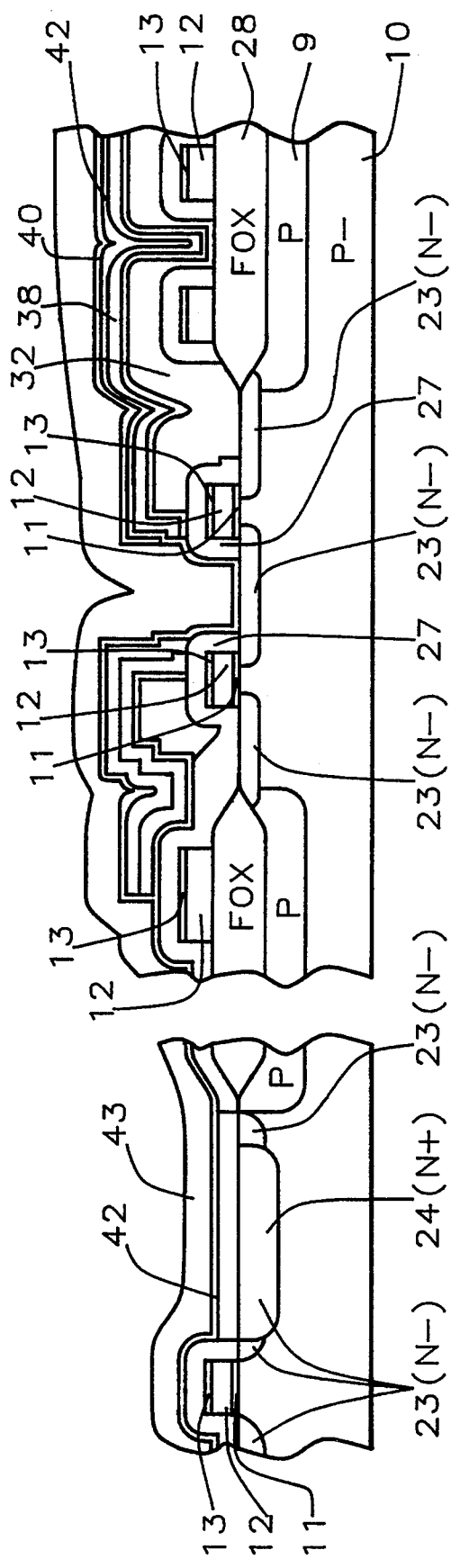
FIGS. 1 through 4 are cross-sectional, schematic drawings showing a first embodiment process and resulting structure to form a stacked capacitor MOSFET structure according to the present invention.

Referring now to FIGS. 1 to 4, there is illustrated one embodiment of the new DRAM process and structure having the improved low leakage and long retention time circuit characteristics. The first series of steps to form this structure involves the formation of the dielectric isolation regions for isolating semiconductor surface regions from other such regions in the semiconductor substrate 10. The semiconductor substrate is preferably composed of P type silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern FOX 28. Underneath the FOX there is often formed a P type junction isolation region 9 as is well known in the art. Then semiconductor devices can be provided in the silicon mesas according to the following processes.

The surface of the silicon substrate 10 is thermally oxidized to form the desired gate oxide 11 thickness. The preferred thickness is between about 60 to 200 Angstroms. The polysilicon layer 12 is blanket deposited by LPCVD (Low Pressure Chemical Vapor Deposition) method. The preferred thickness of the polysilicon layer 12 is between about 1200 to 4000 Angstroms. The polysilicon layer 12 is ion implanted with phosphorous or arsenic ions under the conditions 5 to 10 E 15 dosage atoms per $cm^2$ and 20 to 60 Kev. or doped with phosphorus oxychloride at a temperature about 900° C. The surface of the layer is either thermally oxidized or a chemical vapor deposition process to form silicon oxide layer 13. The layers 11, 12, and 13 are patterned by conventional lithography and anisotropic etching techniques as are conventional in the art to provide a desired pattern of gate electrodes and structure on the FOX 28 surfaces or elsewhere as seen in FIG. 1.

The source/drain structure of the MOS FET may now be formed by the following steps. The FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the ion implantations of N-dopants. Lithographic masks may be required to protect the areas not to be subjected to that particular N− ion implantation. The formation of the lithographic masks are done by conventional lithography and etching techniques. The N− lightly doped drain implantation 23 are done with, for example phosphorous P31 at a dose of between about 1 E 13 to 3 E 14 atoms/$cm^2$ and with an energy of between about 10 to 30 Kev. The designed resulting dopant level is to be 0.5 to 30 E 18 atoms/$cm^3$. The depth of the resulting lightly doped regions is between about 0.05 to 0.20 micrometers.

The dielectric spacer 27 is now to be formed. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 27 is between about 500 to 4000 Angstroms and preferably about 2000 Angstroms.

The selective N+ heavily doped source/drain implantation 24 are done with, for example, arsenic at a dose of between about 5 E 14 to 5 E 15 atoms cm.$^2$ and with an energy of between about 15 to 40 Kev. This selective N+ heavily doped source/drain implantation is done with lithographic photoresist mask to protect the areas not to be subjected to that particular N+ ion implantation. Specifically, the memory cell array areas should not be implanted with N+ ion implantation. The process step could alternatively be done at a later step in the process.

An anisotropic etching of this layer produces the dielectric spacer layer 27 on the sidewalls of the layer structures 11, 12, 13. The preferred anisotropic etching uses a conventional reactive ion etching ambient.

The stacked capacitor structure is fabricated by depositing a polycrystalline silicon layer 32 for the capacitor node over the surface and directly in contact with the lightly doped node regions 23 of the substrate 10 using the same deposition techniques described in regard to polycrystalline silicon layer 12. The thickness of the first layer is typically between about 2000 to 6000 Angstroms. An impurity is introduced into the first layer, either by ion implantation techniques or in situ doping. The impurity concentration in this first layer 32 is preferably between about $10^{18}$ to $10^{21}$ atoms per cm.$^3$.

A thin dielectric layer 38 is deposited. This layer serves as the capacitor dielectric. The thin dielectric or insulating layer has a thickness that is preferably in the range of about 30 to 250 Angstroms. The material of the dielectric layer can be of any suitable material having a high dielectric constant, and which forms a continuous, pinhole free layer. Preferably the dielectric layer is a composite layer of a silicon oxide-silicon nitride-silicon oxide (ONO), or a silicon nitride-silicon oxide (NO) film, with a total thickness of between about 30 to 150 Angstroms. Alternatively, and of particular importance for the future is the dielectric tantalum oxide, such as tantalum pentoxide or in combination with silicon dioxide and/or silicon nitride, or $BaSrTiO_3$, or ferrelectric materials.

As shown in FIG. 1, a second conductive layer 40, such as polycrystalline silicon or the like is deposited over layer 38 and patterned to serve as the second or plate electrode. Also, the polysilicon layer 40 is patterned by lithography and etching techniques. The polycrystalline silicon layer 32 is the storage node of the capacitor. The polycrystalline silicon layer 40 is also doped with an impurity, preferably with a concentration in the range of about $10^{18}$ to $10^{21}$ atoms per cm.$^3$.

The completion of the electrical contacts to the monocrystalline silicon regions such as the bit line 44 contact to lightly doped regions bit line regions 23 is now accomplished. Insulating first interlevel dielectric layer structure is composed of, for example a first layer 42 of silicon dioxide and a second much thicker layer 43 of borophosphosilicate glass, phosphosilicate glass or similar insulating layer. The operational thicknesses of these layers are between about 500 to 2500 Angstroms for the oxide layer 42 and between about 1000 to 5000 or more Angstroms for the glasseous layer 43. These layers are typically deposited by chemical vapor deposition in low pressure or atmospheric pressure, or in a plasma enhanced reactive chamber.

Figure 2:
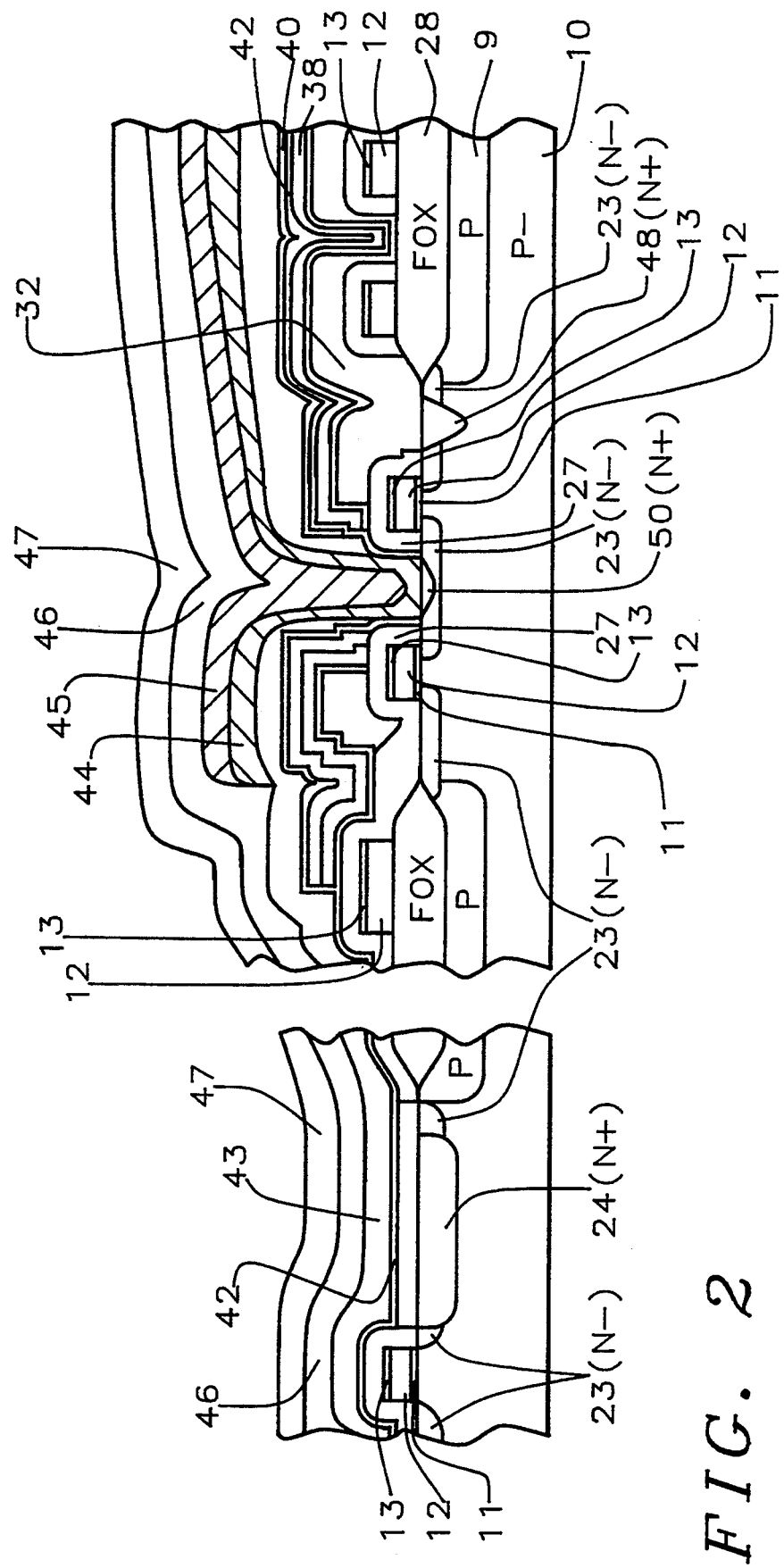

Referring now to FIG. 2, the contact windows or openings are now formed through the insulating layered structure 42, 43 to the lightly doped bit line regions 23 in the cell array region. The openings are not shown to the other regions at this time. This process step is conventionally done by lithography and etching techniques which preferably use a reactive ion etching process that will anisotropically etch both components of the interlevel dielectric layer structure 42, 43. A typical reactive ion etching process using fluorine containing etching chemical species. These oxide/glass layers etching processes are well known to those in the art. The size of the contact window opening can be as small as limitation of the etching and lithography patterning capability.

A second conductive polysilicon, metal or composite metal layer or polycide composite layer (such as tungsten polycide) is deposited over the exposed bit line regions 23 and the interlevel dielectric structure 42 both above and on the sides of the opening. This layer will be the bit line contact. The preferred contact structure is a polycide of two layers, that is polysilicon layer 44 and metal silicide layer 45. These layers may be deposited by, for example low pressure chemical vapor deposition, or sputtering. The operational thickness is between about 200 to 10000 Angstroms and the preferred thickness is between about 2000 to 4000 Angstroms. The thickness of this layer 44, 45 is dependant upon the height and profile of the contact hole. The second conductive layer 44, 45 is patterned by conventional lithography and etching. The dopant concentration of the bit line conductive layer 44 is 5 E 19 to 5 E 21 atoms per cm.$^3$. It is desirable that the doping concentration be this high so that the desired outdiffusion during our subsequent heating step will provide an excellent bit line contact in the lightly doped bit line regions 23. This doping process is done by thermal outdiffusion, it will not cause any ion implantation like silicon damage, and therefore eliminates any stable leakage mechanism and-/or the burst-like random leakage mechanism of VHT phenomenon.

A critical heating step is performed which has several important purposes (1) to anneal out the ion implantation damage in the lightly doped node and bit line regions 23 of the cell array region, (2) to form the highly doped node contact region 48 by outdiffusion from the capacitor polysilicon node layer 32 into the lightly doped regions 23, and (3) to form the highly doped bit line contact regions 50 by outdiffusion from the bit line contact 44, 45 into the lightly doped regions 23. The heating is done at a temperature of between about 800° to 950° C. for between about 20 to 120 minutes, or a rapid thermal anneal (RTA) can be used at a temperature between about 800° to 1000° C. for between about 10 seconds to several minutes. The node contact 48 is deeper and through the lightly doped region 23 and the bit line contact 50 does not pass through the region 23, because the 48 (N+) goes through more thermal process than 50 (N+) in bit line. After 32 is deposited, ONO, 38 and 40 are all thermal CVD deposited. 50 (N+) was done after all these. However, 48 (N+) does not necessarily need to pass through 23 (N−), that is 48 (N+) is deeper than 50 (N+).

We have unexpectedly found that the use of a N+ bit line is not necessary and in fact a disadvantage in the DRAM structure wherein very small feature size of the order of 0.5 micrometers or less. We use a polycide contact as the bit line. This contact of polysilicon and metal silicide can be used as a source of N+ or the like dopant to be out diffused into the N− bit line and capacitor node regions. The silicon substrate can be lightly doped and still a good contact is achieved.

A second interlevel dielectric insulating layer is formed over the exposed patterned second conductive layer (bit line) 44, 45 and the remaining first interlevel dielectric layer. This second interlevel dielectric layer may be a composite layer of, for example layer 46 of silicon oxide and a layer 47 of borophophosilicate glass. Alternatively, as is well understood in the art a sandwich type silicon oxide-spin-on-glass- silicon oxide interlevel dielectric can be used. The total thickness of this second interlevel dielectric layer is between about 1000 to 5000 Angstroms. The methods for depositing these layers are well known to those in the art.

Figure 3:
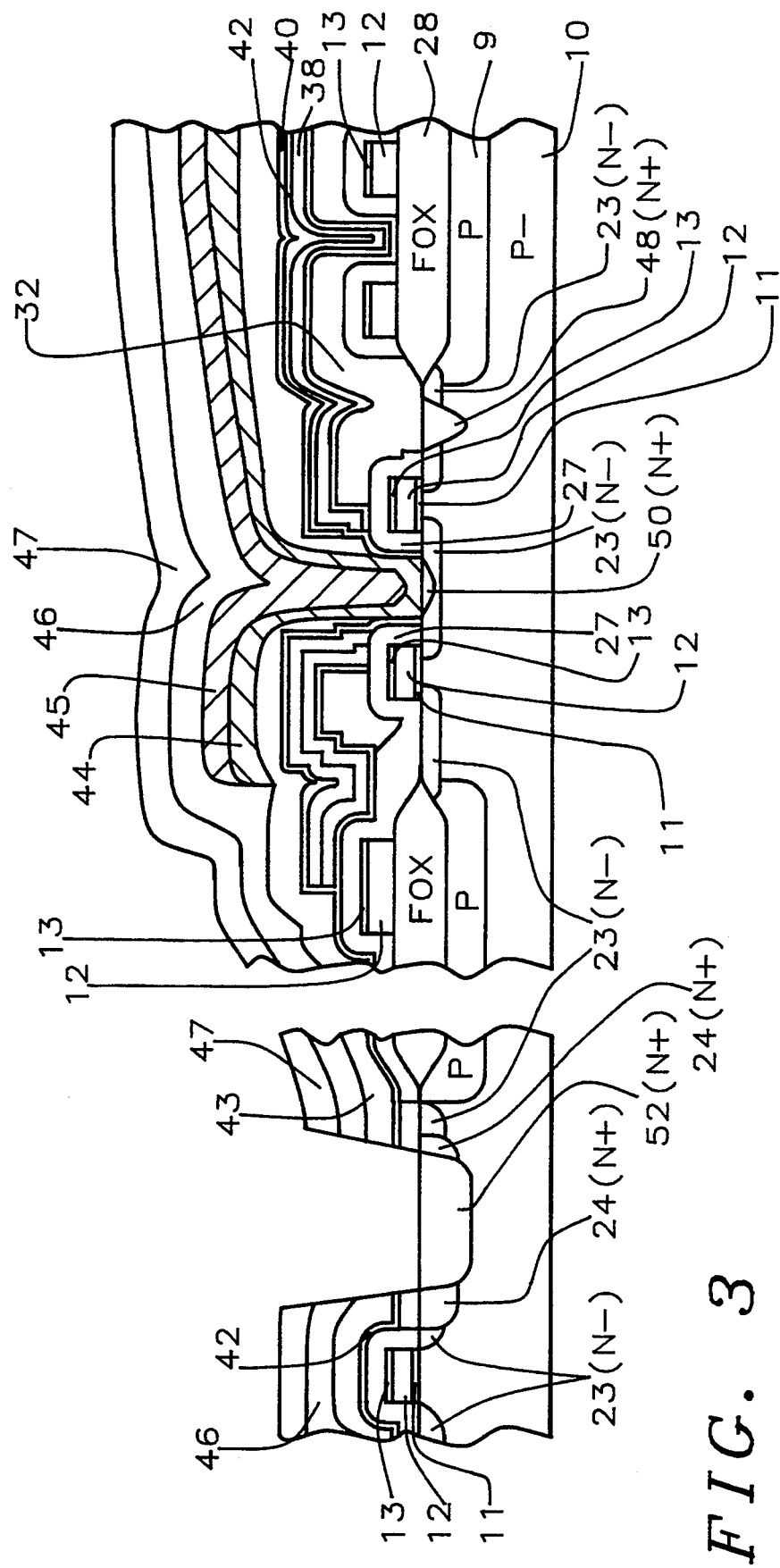
Figure 4:
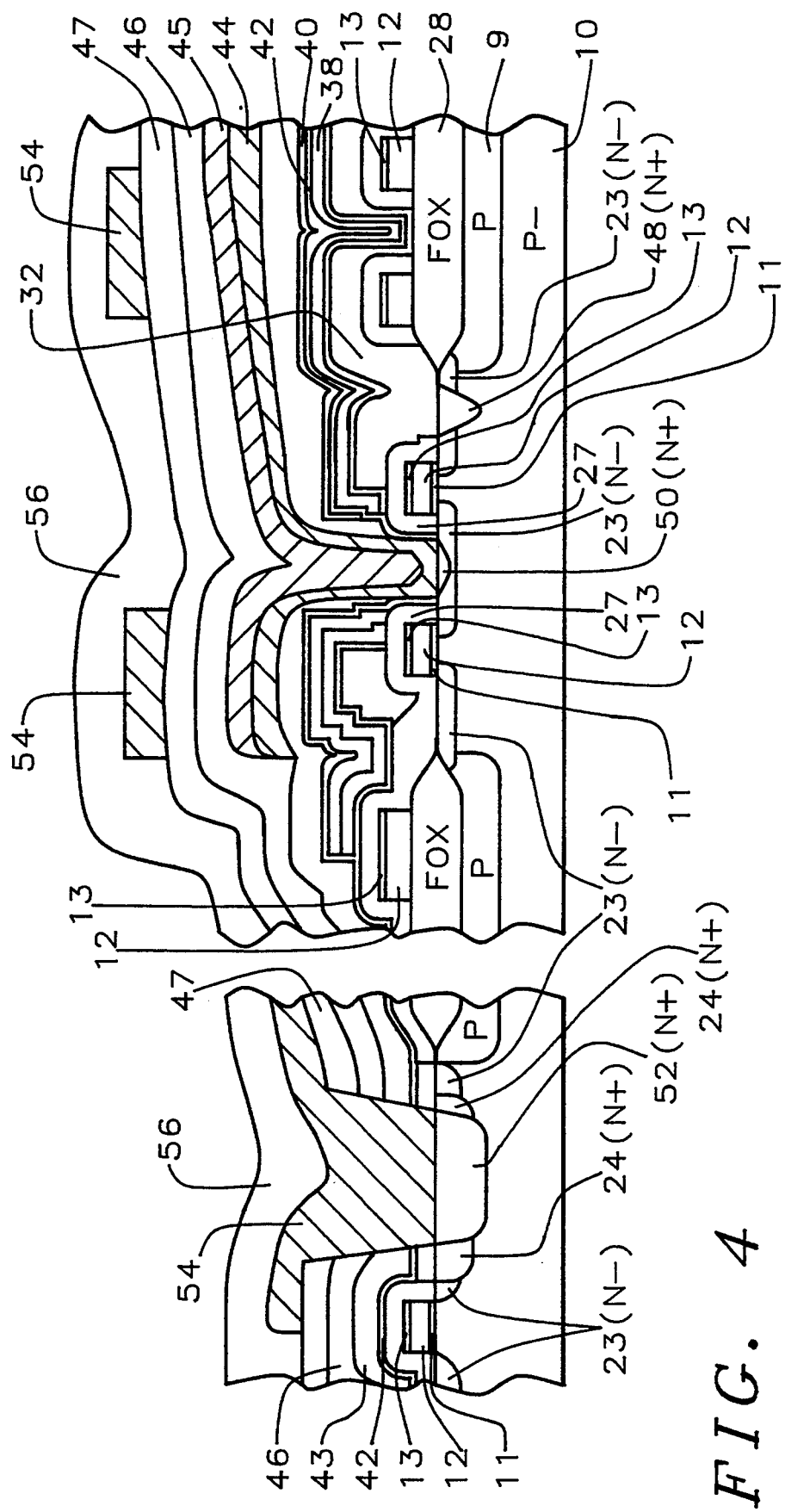

Referring now to FIG. 3, the critical steps to form the peripheral circuits are now formed. An etching step is now used to form contact openings in the peripheral circuit areas to the desired lightly doped regions 23. Openings are made through the first and second interlevel dielectric layers 42, 43, 46, 47 by lithography and etching techniques as is known in the art. The N+ contact ion implantation uses phosphorus with a dose of between about 1 E 14 to 5 E 15 atoms/cm.$^2$ and energy of between about 10 to 30 Kev. to complete the source/drain with contact regions 52 of the N channel lightly doped drain MOSFET peripheral DRAM integrated circuits device as seen in the FIG. 3. It is desired that the N+ region be very shallow and between about 0.05 to 0.35 micrometers, because too deep a junction may cause a leakage problem either through the transistor or through the junction. The resulting dopant level of the N+ regions should be between about 1 E 20 to 5 E 21 atoms/cm.$^3$. This is important because the contact opening etch usually also etches come of the silicon layer away, due to finite etching selectivity, to make the surface dopant concentration too low, which may cause poor metal contact and high resistance.

It is, of course understood that the peripheral circuits may be of the CMOS type and the P-type MOSFET would be conventionally done at a separate time. Further, as is understood in the art a N type tub would be required to be formed into which the P-type MOSFET would then be formed. We refer to S. M. Sze "VLSI TECHNOLOGY" published by McGraw-Hill International—Singapore, 1988, pages 483–487 for conventional CMOS processing for P-type MOSFET devices.

The metallurgy contact 54 is now made to the peripheral regions 54. The contact layer is typically aluminium, aluminum/silicon, tungsten, titanium nickel/tungsten, aluminum/silicon/copper, titanium nickel/aluminum/silicon/copper/titanium nickel, titanium/titanium nickel/aluminum/silicon/copper/titanium nickel, titanium tungsten/aluminum/silicon/copper/titanium tungsten, or titanium/titanium nickel/aluminum/silicon/copper, and their combinations, and deposited by conventional and well understood evaporation, sputtering, chemical vapor deposition or the like and patterned using lithography and etching techniques to produce the final metallurgy structure shown in FIG. 4. Thereafter, a passivation layer 56 is formed thereover as is known in the art. The composition of this layer 56 may be, for example plasma enhanced CVD oxide, spin-on-glass, or their combinations.

The peripheral circuit MOSFETs need N+ source/drain regions since the N+ can largely reduce series resistance and therefore largely enhance the MOSFET performance (such as speed) for a fast circuit. The cell region switching MOSFETs do not need this faster performance, and thus N− regions are sufficient. DRAM speed is bottlenecked by the peripheral speed and not that of the cell array switch transistor.

Figure 5:
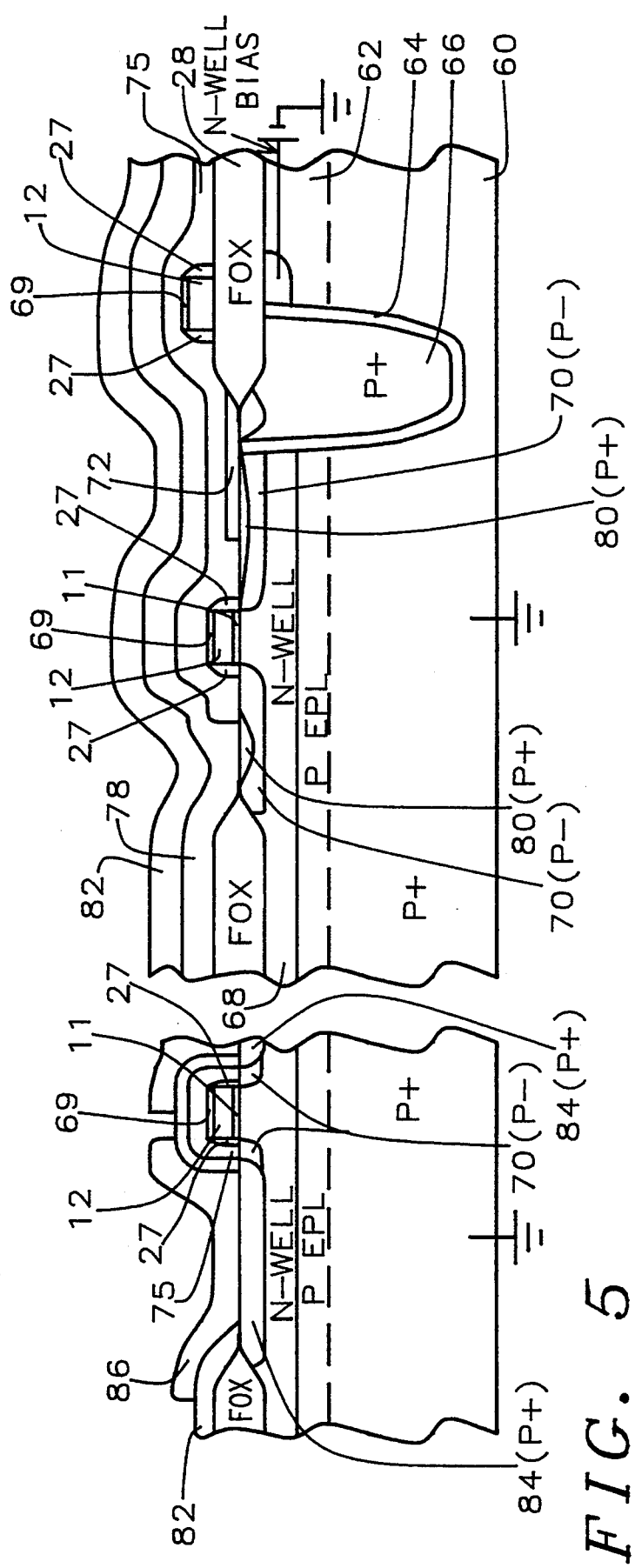
FIG. 5 is cross-sectional, schematic illustration of the result of a second embodiment process and resulting structure to form a trench capacitor MOSFET structure according to the present invention.

Referring now to FIG. 5 and the consideration of the second embodiment of the present invention. We refer to the above cited Nicly C. C. Lu et al paper and the Critchlow et al patent for the general process and resulting structure of this embodiment. The present invention is a modification of these processes and structure to allow superior low leakage and long retention time as described in the first embodiment, but as used in a substrate-plate trench-capacitor memory cell for DRAM.

The FIG. 5 process uses a P+ substrate 60 upon which has been epitaxial grown a P epitaxial layer 62. 5 to 6 micrometer trenches are formed by reactive ion etching into the substrate 60, 62. The composite storage insulator 64, such a silicon oxide/silicon nitride/silicon oxide is formed in the trenches to the equivalent of 30 to 150 angstroms of silicon dioxide as is understood in the art. The trenches are filled with P+ polysilicon 66 and planarized. A retrograde N-well 68 is formed by two phosphorus implants, that is a surface implant and a deep implant using 1.6 MEV. energy. The standard recessed oxide isolation (FOX) 28 is as described above with regard to the first embodiment. The P and N MOSFET devices threshold voltages are then adjusted by a single boron implant as is known in the art.

The MOSFET devices are now formed as taught in the first embodiment wherein the gate dielectric 11 and gate electrode 12 of N+ polysilicon or polycide (N+) are formed and the stack patterned. The ion implantations of P− dopants is used to form the lightly doped bit line regions within the cell array regions and the lightly doped source drain regions in the peripheral circuit regions. Separately the N− doped regions (not shown) of the peripheral circuit regions are formed as is understood by those skilled in the art. Lithographic masks may be required to protect the areas not to be subjected to that particular P− ion implantation. The formation of the lithographic masks are done by conventional lithography and etching techniques. The P− lightly doped drain implantation 70 are done with, for example boron at a dose of between about 1 to 30 E 13 atoms/cm.$^2$ and with an energy of between about 5 to 25 Kev. The designed resulting dopant level is to be 0.5 to 30 E 18 atoms/cm.$^3$. The depth of the resulting lightly doped regions is between about 0.08 to 0.30 micrometers.

The dielectric spacer 27 is now to be formed. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 27 is between about 500 to 4000 Angstroms and preferably about 2000 Angstroms.

An anisotropic etching of this layer produces the dielectric spacer layer 27 on the sidewalls of the layer structures 11, 12. The preferred anisotropic etching uses a conventional reactive ion etching ambient.

The surfaces of the polysilicon gates and source/drain regions are now opened for subsequent selective silicon epitaxy and optional self-aligned silicide formation. This process includes the following steps. A selective silicon epitaxy film is grown on the exposed silicon substrate and polysilicon gate surface, reference S. Wolf, "Silicon Processing for the VLSI Era", Volume 1: Process Technology, Lattice Press. Sunset Beach, Calif. The selective silicon epitaxy can overgrow from polysilicon 66 to the adjacent source/drain area 70, and therefrom form the epitazial layer connector 72. The selectively grown epitaxial layer can be doped heavily (in-situ), reference J. Bloom et al, "The Incorporation of Phosphorus in Silicon Epitaxial Layer Growth", Journal of Electrochemical Society, Volume 121, pp. 354, 1974, or by P+ implantation or by P+ thermal diffusion. Optional self-aligned silicide formation can be performed on the peripheral areas while masking the cell array area. An LDD structure can be formed in the peripheral MOSFETs as in the first embodiment.

The result of this process is a heavily doped epi-layer connector 72 for connection of the trench capacitor to the switch transistor. Also, the LDD MOSFET with P+ source/drain region is formed in the peripheral area only.

The completion of the electrical contacts to the monocrystalline silicon regions such as the bit line 78 contact to lightly doped regions bit line regions 70 is now accomplished. Insulating first interlevel dielectric layer structure 75 is composed of, for example a first layer of silicon dioxide and a second much thicker layer of borophosphosilicate glass, phosphosilicate glass or similar insulating layer. These layers are similar to that of layer 42, 43 of the first embodiment.

The contact windows or openings are now formed through the insulating layered structure 75 to the lightly P— doped bit line regions 70 in the cell array region. The openings are not made to the other regions at this time. This process step is conventionally done by lithography and etching techniques which preferably use a reactive ion etching process that will anisotropically etch both components of the interlevel dielectric layer structure 75. A typical reactive ion etching process using fluorine containing etching chemical species. These oxide/glass layers etching processes are well known to those in the art. The size of the contact window opening can be as small as limitation of the etching and lithography patterning capability.

A second conductive polysilicon, metal or composite metal layer or polycide composite layer (such as tungsten polycide) 78 is deposited over the exposed bit line regions 70 and the interlevel dielectric structure 75 both above and on the sides of the opening. This layer 78 will be the bit line contact. The contact structure process and structure is the same possible alternatives as described with reference to the first embodiment above. The layer 78 is patterned by conventional lithography and etching. The dopant concentration of the bit line conductive layer 78 is high enough to allow the desired outdiffusion during our subsequent heating step with provide an excellent P+ bit line contact in the lightly doped bit line regions 70.

A critical heating step is performed which has several important purposes (1) to anneal out the ion implantation damage in the lightly doped P— bit line regions 70 of the cell array region, and (2) to form the highly doped bit line contact regions 80 by outdiffusion from the bit line contact 78 into the lightly doped regions 70. The heating is done at a temperature of between about 800° to 950° C. for between about 20 to 120 minutes. Also, the rapid thermal anneal (RTA) process can be used, as in the first embodiment.

A second interlevel dielectric insulating layer 82 is formed over the exposed patterned second conductive layer (bit line) 78 and the remaining first interlevel dielectric layer. This second interlevel dielectric layer 82 may be a composite layer of, for example layer of silicon oxide and a layer of borophophosilicate glass. Alternatively, as is well understood in the art a sandwich type silicon oxide-spin-on-glass- silicon oxide interlevel dielectric can be used. The total thickness of this second interlevel dielectric layer is as was described with regard to the first embodiment.

The critical steps to complete the formation of the peripheral circuits are now done. An etching step is now used to form contact openings in the peripheral circuit areas to the desired lightly doped P— regions 70. Openings are made through the first and second interlevel dielectric layers 75, 82 by lithography and etching techniques as is known in the art. The P+ source/drain contact hole ion implantation uses $BF_2$ with a dose of between about 1 E 14 to 5 E 15 atoms/cm.$^2$ and energy of between about 10 to 40 Kev. to complete the source/drain contact hole regions 84 of the P channel lightly doped drain MOSFET peripheral DRAM integrated circuits device. It is desired that the P+ region be very shallow and between about 0.08 to 0.35 micrometers, because too deep a junction may cause leakage either through the transistor or the junction. The resulting dopant level of the P+ regions should be between about 1 E 20 to 5 E 21 atoms/cm.$^3$. This is important because the contact hole etch usually will also etch some of the silicon layer away, due to finite etching selectively, to make the residue surface dopant concentration too low and thus cause poor metal contact and high resistance.

It is, of course understood that the peripheral circuits may be of the CMOS type and the N-type MOSFET would be conventionally done at a separate time to complete the peripheral circuits.

The metallurgy contact 86 is now made to the peripheral regions 84. The contact layer is typically aluminum, aluminum/silicon, tungsten, titanium nickel/tungsten, aluminum/silicon/copper, titanium nickel/aluminum/silicon/copper/titanium nickel, titanium/titanium nickel/aluminum/silicon/copper titanium nickel, titanium tungsten/aluminum/silicon/copper/titanium tungsten, or titanium/titanium nickel/aluminum/silicon/copper, and their combinations, and deposited by conventional and well understood evaporation, sputtering, chemical vapor deposition or the like and patterned using lithography and etching techniques to produce the final metallurgy structure shown in FIG. 5.

Figure 6:
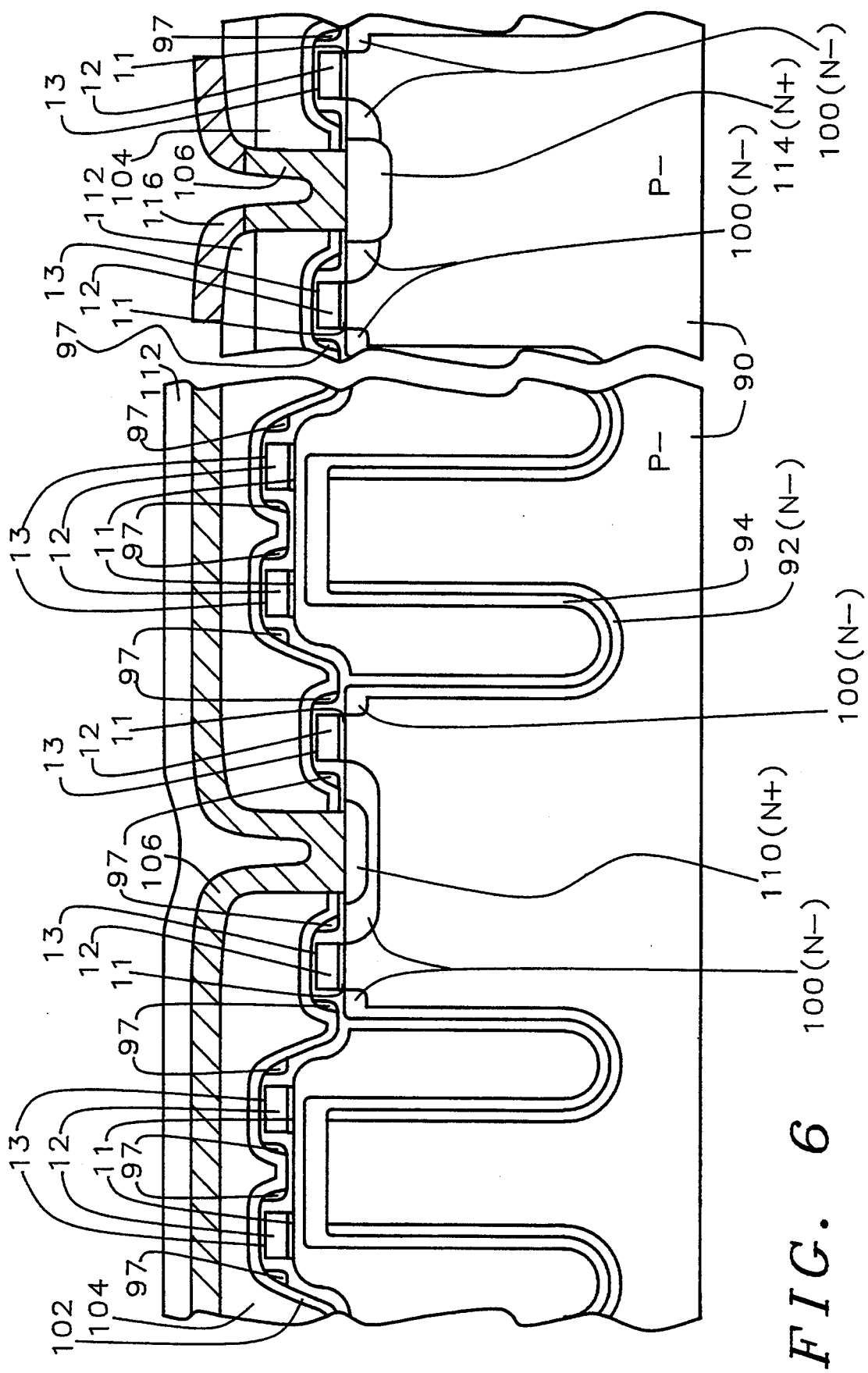
FIG. 6 is cross-sectional, schematic illustration of the result of a third embodiment process and resulting structure to form a trench capacitor MOSFET structure according to the present invention.

Referring now to FIG. 6 and the consideration of the third embodiment of the present invention. We refer to the above cited B. W. Shen et al paper for the general process and resulting structure of this embodiment. The present invention is a modification of these processes and structure to allow superior low leakage and low retention time as described in the first embodiment, but as used in a trench capacitor memory cell for DRAM.

The FIG. 6 process uses a P— substrate 90. Six micrometer trenches are formed by reactive ion etching into the substrate 60. An N— implant layer 92 is formed around the periphery of the trenches. The composite storage insulator 94, such a silicon oxide/silicon nitride/silicon oxide is formed in the trenches as is understood in the art. The trenches are filled with highly doped polysilicon 96 and planarized. The standard recessed oxide isolation (FOX) (not shown because it is mostly used in the periphery circuits) is as described above with regard to the first embodiment. The P and N MOSFET devices threshold voltages are then adjusted by a single boron implant as is known in the art.

The MOSFET devices are now formed as taught in the first embodiment wherein the gate dielectric 11 and gate electrode 12 of N+ polysilicon are formed and the stack patterned. A silicon oxide layer 13 is formed thereover. The ion implantations of N− dopants through silicon oxide layer 13 is used to form the lightly doped bit line regions within the cell array regions and the lightly doped source drain regions in the peripheral circuit regions. Separately the P− doped regions (not shown) of the peripheral circuit regions are formed as is understood by those skilled in the art. Lithographic masks may be required to protect the areas not to be subjected to that particular N− ion implantation. The formation of the lithographic masks are done by conventional lithography and etching techniques. The N− lightly doped drain implantation 100 are done with, for example P31 at a dose of between about 1 E 13 to 3 E 14 atoms/cm.$^2$ and with an energy of between about 10 to 30 Kev. The designed resulting dopant level is to be 0.5 to 30 E 18 atoms/cm.$^3$. The depth of the resulting lightly doped regions is between about 0.05 to 0.20 micrometers.

The dielectric spacer 97 is now to be formed. A low temperature silicon nitride deposition is preferred such as through the chemical vapor deposition as is known in the art. The thickness of the dielectric silicon nitride layer 97 is between about 500 to 4000 Angstroms and preferably about 2000 Angstroms.

An anisotropic etching of this layer produces the dielectric spacer layer 97 on the sidewalls of the layer structures 11, 12, 13. The preferred anisotropic etching uses a conventional reactive ion etching ambient. The selective N+ heaving doped source/drain implantation 114 are done with, for example, arsenic at a does of between about 5 E 14 to 5 E 15 atoms/cm.$^2$ and with an energy of between about 15 to 40 Kev. This selective N+ heavily doped source/drain implantation is done with lithographic photoresist mask to protect the areas not to be subjected to that particular N+ ion implantation. Specifically, the memory cell array areas should not be implanted with N+ ion implantation.

The completion of the electrical contacts to the monocrystalline silicon regions such as the bit line contact to lightly doped regions bit line regions 100 is now accomplished. Insulating first interlevel dielectric layer structure is composed of, for example a first layer 102 of silicon dioxide and a second much thicker layer 104 of borophosphosilicate glass, phosphosilicate glass or similar insulating layer. These layers are similar to that of layer 42, 43 of the first embodiment.

The contact windows or openings are now formed through the insulating layered structure 102, 104 to the lightly N− doped bit line regions 100 in the cell array region. The openings are not made to the other regions at this time. This process step is conventionally done by lithography and etching techniques which preferably use a reactive ion etching process that will anisotropically etch both components of the interlevel dielectric layer structure 102, 104. A typical reactive ion etching process using fluorine containing etching chemical species. These oxide/glass layers etching processes are well known to those in the art. The size of the contact window opening can be as small as limitation of the etching and lithography patterning capability.

A second conductive polysilicon, metal or composite metal layer or polycide composite layer (such as tungsten polycide) 106 is deposited over the exposed bit line regions 100 and the interlevel dielectric structure 102,104 both above and on the sides of the opening. This layer 106 will be the bit line contact. The contact structure process and structure is the same possible alternatives as described with reference to the first embodiment above. The layer 106 is patterned by conventional lithography and etching. The dopant concentration of the bit line conductive layer which is preferably silicided polysilicon 106 is high enough to allow the desired outdiffusion during our subsequent heating step with provide an excellent N+ bit line contact in the lightly doped bit line regions 100.

A critical heating step is performed which has several important purposes (1) to anneal out the ion implantation damage in the lightly doped N− bit line regions 100 of the cell array region, and (2) to form the highly doped bit line contact regions 110 by outdiffusion from the bit line contact 106 into the lightly doped regions 100. The heating is done at a temperature of between about 800° to 950° C. for between about 20 to 120 minutes, or a rapid thermal anneal (RTA) can be used at a temperature between about 800° to 1000° C. for between about 10 seconds to several minutes.

A second interlevel dielectric insulating layer 112 is formed over the exposed patterned second conductive layer (bit line) 106 and the remaining first interlevel dielectric layer 102, 104. This second interlevel dielectric layer 112 may be a composite layer of, for example layer of silicon oxide and a layer of borophosphosilicate glass. Alternatively, as is well understood in the art a sandwich type silicon oxide-spin-on-glass- silicon oxide interlevel dielectric can be used. The total thickness of this second interlevel dielectric layer is as was described with regard to the first embodiment.

The critical steps to complete the formation of the peripheral circuits are now done. An etching step is now used to form contact openings in the peripheral circuit areas to the desired lightly doped N− regions 100. Openings are made through the first and second interlevel dielectric layers 102,104, 112 by lithography and etching techniques as is known in the art. The N+ source/drain contact hole ion implantation uses P31 with a dose of between about 1 E 14 to 5 E 15 atoms/cm.$^2$ and energy of between about 10 to 40 Kev. to complete the source/drain regions 114 of the N channel lightly doped drain MOSFET peripheral DRAM integrated circuits device. It is desired that the N+ region be very shallow and between about 0.05 to 0.35 micrometers, because too deep a junction may cause a leakage problem either through the transistor or through the junction. The resulting dopant level of the N+ regions should be between about 1 E 20 to 5 E 21 atoms/cm.$^3$.

It is, of course understood as already suggested with regard to the embodiments above, that the peripheral circuits may be of the CMOS type and the N-type MOSFET would be conventionally done at a separate time to complete the peripheral circuits.

The metallurgy contact 116 is now made to the peripheral regions 114. The contact layer is typically aluminium, aluminum/silicon, tungsten, titanium nickel/tungsten, aluminum/silicon/copper, titanium nickel-/aluminum/silicon/copper/titanium nickel, titanium/- titanium nickel/aluminum/silicon/copper/titanium nickel, titanium tungsten/aluminum/silicon/copper/titanium tungsten, or titanium/titanium nickel/aluminum/silicon/copper, and their combinations, and deposited by conventional and well understood evaporation, sputtering, chemical vapor deposition or the like and patterned using lithography and etching techniques to produce the final metallurgy structure shown in FIG. 6.

While the invention has been particularly shown and described with reference to the preferred embodiments thereof, it will be understood by those skilled in the art that various changes in form and details may be made without departing from the spirit and scope of the invention.

What is claimed is:

1. The method for making a DRAM MOSFET integrated circuit which includes a cell array region and a peripheral circuits region having low leakage and long retention time in a semiconductor wafer comprising:

providing a pattern of gate dielectric and gate electrode structures over said semiconductor wafer having a first conductivity imparting dopant in the cell array region and the peripheral circuits region of said integrated circuit;

using said pattern of gate dielectric and gate electrode structures and ion implantation to form lightly doped regions of a second and opposite conductivity imparting dopant in said semiconductor wafer wherein said lightly doped regions within said cell array region are to be bit line regions;

forming insulator structures upon the sidewall of said pattern of gate dielectric and gate electrode structures;

forming a capacitor in electrical contact with certain of said lightly doped regions within said cell array region;

forming an interlevel dielectric insulating layer over the surface of the resultant structure;

forming openings through said interlevel dielectric insulating layer to said bit line regions of lightly doped regions;

forming a highly doped bit line contact to said bit line regions;

heating the structure at about 800°–1000° C. to anneal out the ion implantation damage in said lightly doped regions caused by the ion implantation into said lightly doped regions and to cause outdiffusion from said doped capacitor node layer and said doped bit line contact layer to form a highly doped capacitor node contact and highly doped bit line contact, respectively within said lightly doped regions whereby said low leakage and long retention time are the resulting circuit characteristics;

forming openings to the desired said lightly doped regions of said peripheral circuits;

ion implanting highly doped conductivity imparting dopants of said second and opposite conductivity through said openings to form highly doped source/drain regions of said second and opposite conductivity;

and making electrical contact to said peripheral circuits through said openings to complete said DRAM MOSFET integrated circuit.

2. The method of claim 1 wherein said capacitor is a stacked capacitor and said bit line contact layer is a polycide layer.

3. The method of claim 1 wherein said lightly doped regions are N−, said highly doped bit line contact regions are N+ and said highly doped second and opposite dopants ion implanted into said peripheral regions are N+.

4. The method of claim 1 wherein said capacitor is a trench capacitor, said polysilicon is P+, said highly doped bit line contact regions are P+ and said highly doped second and opposite dopants ion implanted into said peripheral regions are P+ and said lightly doped regions are P−.

5. The method of claim 1 wherein said capacitor is a trench capacitor, said polysilicon is N+, said highly doped bit line contact regions are N+ and said highly doped second and opposite dopants ion implanted into said peripheral regions are N+ and said lightly doped regions are N−.

6. The method of claim 2 wherein said first conductivity imparting dopant is P type, the second and opposite conductivity imparting dopant is N type, said lightly doped regions have a conductivity of between about 0.5 E 18 to 30 E 18 atoms/cm$^3$, said highly doped bit line contact regions have a conductivity of between about 5 E 19 and 5 E 21 atoms/cm$^3$ and said highly doped regions in said peripheral circuits areas have a conductivity of between about 1 E 20 to 5 E 21 atoms/cm$^3$.

7. The method of claim 5 wherein said first conductivity imparting dopant is P type, the second and opposite conductivity imparting dopant is N type, said lightly doped regions have a dopant concentration level of between about 0.5 E 18 to 30 E 18 atoms/cm3, said highly doped bit line contact regions have a dopant concentration level of between about 5 E 19 and 5 E 21 atoms/cm3 and said highly doped regions in said peripheral circuits areas have a dopant concentration level of between about 1 E 20 to 5 E 21 atoms/cm3.

8. The method of claim 4 wherein said first conductivity imparting dopant is N type, the second and opposite conductivity imparting dopant is P type, said lightly doped regions have a dopant concentration level of between about 0.5 E 18 to 30 E 18 atoms/cm3, said highly doped bit line contact regions have a dopant concentration level of between about 5 E 19 and 5 E 21 atoms/cm3 and said highly doped regions in said peripheral circuits areas have a dopant concentration level of between about 1 E 20 to 5 E 21 atoms/cm3.

9. The method of claim 1 wherein said heating to anneal and remove ion implantation damage, from said highly doped bit line contact uses a temperature of between about 800° and 950° C. for between about 20 to 120 minutes.

10. The method of claim 1 wherein said heating to anneal and remove ion implantation damage from said highly doped bit line contact is accomplished by a rapid thermal anneal (RTA) at a temperature of between about 800° to 1000° C. for betwwen about 10 seconds and several minutes.

11. The method for making a DRAM integrated circuit having a cell array composed of MOSFET devices and associated stacked capacitors, and peripheral circuits wherein there is low leakage and long retention time in said cell array comprising:

providing a pattern of gate dielectric and gate electrode structures over a semiconductor wafer having a first conductivity imparting dopant in the cell array region and the peripheral circuits region of said integrated circuit;

using said pattern of gate dielectric and gate electrode structures and ion implantation to form lightly doped regions of a second and opposite conductivity imparting dopant in said semiconductor wafer wherein said lightly doped regions within said cell array region to be capacitor node regions and bit line regions;

forming insulator structures upon the sidewall of said pattern of gate dielectric and gate electrode structures;

forming a stacked capacitor in electrical contact with capacitor node regions of said lightly doped regions within said cell array region;

said capacitor includes a doped polysilicon node layer of the said second and opposite conductivity, a capacitor dielectric, and a doped polysilicon plate layer;

forming an interlevel dielectric insulating layer over the surface of the resultant structure;

forming openings through said interlevel dielectric insulating layer to said bit line regions of lightly doped regions;

forming a highly doped polycide bit line contact to said bit line regions;

heating the structure at about 800°–1000° C. to anneal out the ion implantation damage in said lightly doped regions caused by the ion implantation into said lightly doped regions and to cause outdiffusion from said doped capacitor node layer and said doped bit line contact layer to form a highly doped node contact and highly doped bit line contact, respectively within said lightly doped regions whereby said low leakage and long retention time are the resulting circuit characteristics;

forming openings to the desired said source and drain regions of said peripheral circuits;

ion implanting highly doped conductivity imparting dopants of said second and opposite conductivity through said openings to form highly doped source/drain regions of said second and opposite conductivity;

and making electrical contact to said peripheral circuits through said openings to complete said DRAM MOSFET integrated circuit.

12. The method of claim 11 wherein said capacitor node layer is N+, said lightly doped regions are N−, said highly doped node contact regions and bit line contact regions are N+ and said highly doped second and opposite dopants ion implanted into said peripheral regions are N+.

13. The method of claim 12 wherein said first conductivity imparting dopant is P type, the second and opposite conductivity imparting dopant is N type, said lightly doped regions have a dopant concentration level of between about 0.5 E 18 to 30 E 18 atoms/cm3, said highly doped node and bit line contact regions have a dopant concentration level of between about 5 E 19 and 5 E 21 atoms/3 and said highly doped regions in said peripheral circuits areas have a dopant concentration level of between about 1 E 20 to 5 E 21 atoms/cm3.

14. The method of claim 11 wherein said heating to anneal and remove ion implantation damage, form said highly doped node contact and highly doped bit line contact uses a temperature of between about 800° and 950° C. for between about 20 to 120 minutes.

15. The method of claim 11 wherein said heating to anneal and remove ion implantation damage from said highly doped bit line contact is accomplished by a rapid thermal anneal (RTA) at a temperature of between about 800° to 1000° C. for between about 10 seconds and several minutes.

* * * * *

UNITED STATES PATENT AND TRADEMARK OFFICE
CERTIFICATE OF CORRECTION

PATENT NO. : 5,395,784
DATED : March 7, 1995
INVENTOR(S) : Chih-Yuan Lu, Nicky C. Lu, Hsiao-Chin Tuan It is certified that error appears in the above-indentified patent and that said Letters Patent is hereby corrected as shown below:

On the title page, item (73) add:

--Etron Technology, Inc.--
Hsinchu, Taiwan

Signed and Sealed this

Twenty-fifth Day of March, 1997

Attest:

BRUCE LEHMAN

Attesting Officer

Commissioner of Patents and Trademarks